United States Patent
Pourquier et al.

(10) Patent No.: US 9,954,141 B2
(45) Date of Patent: Apr. 24, 2018

(54) PROCESS FOR FABRICATING SEMICONDUCTOR NANOWIRES OR MICROWIRES HAVING INSULATED ROOTS

(71) Applicants: Aledia, Grenoble (FR); Commissariat à l'Énergie Atomique et aux Énergies Alternatives, Paris (FR)

(72) Inventors: Eric Pourquier, Grenoble (FR); Philippe Gibert, Saint-Etienne-de-Crossey (FR); Brigitte Martin, Saint Egreve (FR)

(73) Assignees: Aledia, Grenoble (FR); Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/538,148

(22) PCT Filed: Dec. 24, 2015

(86) PCT No.: PCT/FR2015/053758
§ 371 (c)(1),
(2) Date: Jun. 20, 2017

(87) PCT Pub. No.: WO2016/108023
PCT Pub. Date: Jul. 7, 2016

(65) Prior Publication Data
US 2018/0019376 A1     Jan. 18, 2018

(30) Foreign Application Priority Data
Dec. 29, 2014   (FR) .................................. 14 63372

(51) Int. Cl.
*H01L 33/34*     (2010.01)
*H01L 33/24*     (2010.01)
(Continued)

(52) U.S. Cl.
CPC ........ *H01L 33/24* (2013.01); *H01L 31/02161* (2013.01); *H01L 31/022408* (2013.01);
(Continued)

(58) Field of Classification Search
CPC ....... H01L 31/035227; H01L 31/02161; H01L 31/022408; H01L 33/24; H01L 33/405;
(Continued)

(56) References Cited

U.S. PATENT DOCUMENTS

| 2011/0253982 | A1  | 10/2011 | Wang et al. |
| 2014/0299751 | A1* | 10/2014 | Tang ..................... G01J 1/0425  250/227.11 |
| 2017/0062213 | A1* | 3/2017  | Patolsky ........... H01L 21/02606 |

FOREIGN PATENT DOCUMENTS

| WO | WO 2014/064276 A1 | 5/2014 |
| WO | WO 2014/064395 A1 | 5/2014 |
| WO | WO 2014/196920 A1 | 12/2014 |

OTHER PUBLICATIONS

International Search Report for Application No. PCT/FR2015/053758 dated Mar. 10, 2016.
(Continued)

*Primary Examiner* — (Vikki) Hoa B Trinh
(74) *Attorney, Agent, or Firm* — Wolf, Greenfield & Sacks, P.C.

(57) ABSTRACT

A process for fabricating an electronic device including a substrate and microwires or nanowires resting on the substrate, the process including successive steps of covering the wires with an insulating layer, covering the insulating layer with an opaque layer, depositing a first photoresist layer over the substrate between the wires, etching the first photoresist layer over a first thickness by photolithography, etching the first photoresist layer remaining after the preceding step over a second thickness by plasma etching, etching the portion of the opaque layer not covered by the first photoresist layer
(Continued)

remaining after the preceding step, etching the portion of the insulating layer not covered by the opaque layer, removing the first photoresist layer remaining after the preceding step, and removing the opaque layer.

10 Claims, 5 Drawing Sheets

(51) Int. Cl.
    *H01L 33/44*     (2010.01)
    *H01L 33/06*     (2010.01)
    *H01L 33/40*     (2010.01)
    *H01L 33/08*     (2010.01)
    *H01L 31/0224*     (2006.01)
    *H01L 31/0216*     (2014.01)
    *H01L 31/0352*     (2006.01)

(52) U.S. Cl.
    CPC ...... *H01L 31/035227* (2013.01); *H01L 33/06* (2013.01); *H01L 33/08* (2013.01); *H01L 33/405* (2013.01); *H01L 33/44* (2013.01); H01L 2933/0016 (2013.01); H01L 2933/0025 (2013.01)

(58) Field of Classification Search
    CPC ......... H01L 33/06; H01L 33/44; H01L 33/08; H01L 2933/0025
    See application file for complete search history.

(56) References Cited

OTHER PUBLICATIONS

Written Opinion of the International Searching Authority for International Application No. PCT/FR2015/053758 dated Mar. 10, 2016.

* cited by examiner

PROCESS FOR FABRICATING SEMICONDUCTOR NANOWIRES OR MICROWIRES HAVING INSULATED ROOTS

This application is the national phase of International Application No. PCT/FR2015/053758, filed on Dec. 24, 2015, which claims priority to French Patent Application No. 14/63372, filed on Dec. 29, 2014, which applications are incorporated herein by reference to the maximum extent allowable.

BACKGROUND

The present invention generally relates to methods of manufacturing electronic devices comprising microwires or nanowires made of a semiconductor material.

DISCUSSION OF THE RELATED ART

Microwires or nanowires comprising a semiconductor material particularly enable to manufacture optoelectronic devices. Term "optoelectronic devices" is used to designate devices capable of converting an electric signal into an electromagnetic radiation or the other way, and especially devices dedicated to detecting, measuring, or emitting an electromagnetic radiation or devices dedicated to photovoltaic applications.

For certain structures where the nanowires or microwires are formed on a support, it is necessary to cover with an insulating layer the lower portion of each nanowire or microwire, as well as the support between the nanowires or microwires, while the upper portion of each nanowire or microwire is not covered with this insulating layer. It may however be difficult to achieve a uniform insulation of the feet of an assembly of nanowires or microwires, in particular to insulate the lower portion of each nanowire or microwire up to a height which is substantially the same for all microwires and nanowires.

SUMMARY

Thus, an object of an embodiment is to at least partly overcome the disadvantages of previously-described optoelectronic devices comprising microwires or nanowires.

Another object of an embodiment is for the heights of insulation of the lower portions of nanowires or microwires of an assembly of nanowires or microwires to be substantially equal.

Another object of an embodiment is to be able to form the optoelectronic device at an industrial scale and at a low cost.

Thus, an embodiment provides a method of manufacturing an electronic device comprising a substrate and microwires or nanowires resting on the substrate, the method comprising the successive steps of:

a) covering the microwires or nanowires with an insulating layer;

b) covering the insulating layer with an opaque layer;

c) depositing a first resist layer extending on the substrate between the wires;

d) etching the first resist layer across a first thickness by photolithography;

e) etching the first resist layer remaining after step d) across a second thickness by plasma etching;

f) etching the portion of the opaque layer which is not covered with the first resist layer remaining after step e);

g) etching the portion of the insulating layer which is not covered with the opaque layer;

h) removing the first resist layer remaining after step e); and i) removing the opaque layer.

According to an embodiment, the height of the microwires or nanowires is in the range from 250 nm to 50 µm.

According to an embodiment, the maximum thickness of the first resist layer at step c) is greater than the height of the microwires or nanowires.

According to an embodiment, the thickness of the insulating layer is in the range from 5 nm to 1 µm.

According to an embodiment, the plasma etching is an oxygen plasma etching.

According to an embodiment, the opaque layer is made of a metal or of a metal alloy.

According to an embodiment, the thickness of the opaque layer is in the range from 5 nm to 1 µm.

According to an embodiment, the method further comprises, after step i), the successive steps of:

j) forming a shell on the portion of each microwire or nanowire which is not covered with the insulating layer, the shell comprising an active region capable of capturing or of emitting most of the radiation supplied or captured by the electronic device;

k) forming an electrode layer on the shells and on the insulating layer;

l) covering the electrode layer with a conductive layer;

m) depositing a second resist layer extending on the conductive layer between the wires;

n) delimiting in the second resist layer, by photolithography, a resist block extending between the microwires or nanowires;

o) etching the resist block across a third thickness by plasma etching;

p) etching the portion of the second reflective conductive layer which is not covered with the resist block remaining after step o); and q) removing the second resist layer remaining after step o).

According to an embodiment, step n) comprises the steps of:

r) partially illuminating the second resist layer across a fourth thickness;

s) illuminating portions of the second resist layer across its entire thickness by using a masking screen; and t) etching the portions of the second resist layer illuminated at steps r) and s).

According to an embodiment, the conductive layer is reflective.

BRIEF DESCRIPTION OF THE DRAWINGS

The foregoing and other features and advantages will be discussed in detail in the following non-limiting description of dedicated embodiments in connection with the accompanying drawings, among which.

DETAILED DESCRIPTION

Figure 1:
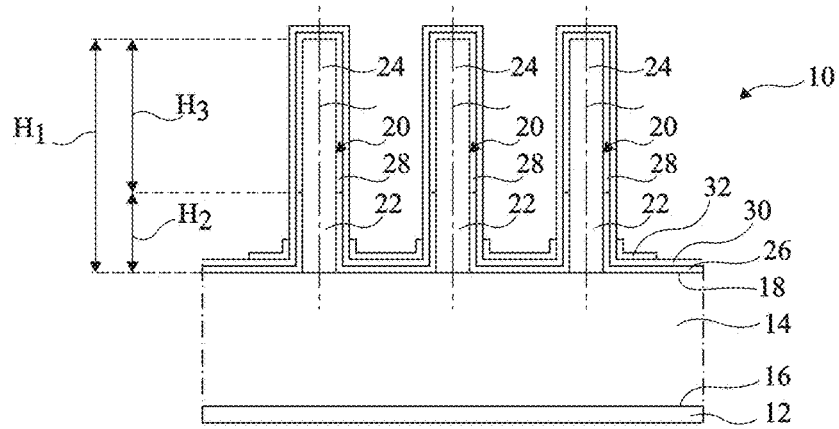
FIG. 1 is a partial simplified cross-section view of an embodiment of an optoelectronic device comprising microwires or nanowires.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the optoelectronic device biasing and control means are well known and will not be described. In the following description, unless otherwise indicated, terms "substantially", "approximately", and "in the order of" mean "to within 10%", preferably to within 5%.

The present application particularly relates to electronic devices having a three-dimensional structure comprising three-dimensional elements, for example, microwires, nanowires, conical elements, or frustoconical elements. In particular, a conical or frustoconical element may be a circular conical or frustoconical element or a pyramidal conical or frustoconical element. In the following description, embodiments are particularly described for electronic devices having a three-dimensional structure comprising microwires or nanowires. However, such embodiments may be implemented for three-dimensional elements other than microwires or nanowires, for example, conical or frustoconical three-dimensional elements.

Term "microwire", "nanowire", "conical element", or "frustoconical element" designates a three-dimensional structure having a shape elongated along a preferred direction, having at least two dimensions, called minor dimensions, in the range from 5 nm to 2.5 µm, preferably from 50 nm to 2.5 µm, the third dimension, called major dimension, being greater than or equal to 1 time, preferably greater than or equal to 5 times, and more preferably still greater than or equal to 10 times, the largest minor dimension. In certain embodiments, the minor dimensions may be smaller than or equal to approximately 1 µm, preferably in the range from 100 nm to 1 µm, more preferably from 100 nm to 800 nm. In certain embodiments, the height of each microwire or nanowire may be greater than or equal to 500 nm, preferably in the range from 1 µm to 50 µm.

In the following description, term "wire" is used to mean "microwire" or "nanowire". Preferably, the median line of the wire which runs through the centers of gravity of the cross-sections, in planes perpendicular to the preferred direction of the wire, is substantially rectilinear and is called "axis" of the wire hereafter.

In the following description, embodiments will be described in the case of an optoelectronic device comprising light-emitting diodes. It should however be clear that these embodiments may concern other applications, particularly devices dedicated to the detection or to the measurement of electromagnetic radiation or devices dedicated to photovoltaic applications.

FIG. 1 is a partial simplified cross-section view of an optoelectronic device 10 formed from wires such as previously described and capable of emitting an electromagnetic radiation.

Device 10 comprises, from bottom to top in FIG. 1:
a first biasing electrode 12;
a substrate 14, for example, semiconductor, comprising parallel surfaces 16 and 18, where surface 16 is in contact with electrode 12 and surface 18 may be treated to favor the growth of wires in organized fashion, and the treatment may comprise forming a layer, not shown, at the surface of substrate 14;
wires 20 of axis Δ (three wires being shown) of height $H_1$, each wire comprising a lower portion 22 of height $H_2$, in contact with surface 18, and an upper portion 24 of height $H_3$;

an insulating layer 26 covering the periphery of a portion of each lower portion 22 and covering substrate 14 between wires 20;
a shell 28 covering each upper portion 24;
a second electrode layer 30 covering shells 28 and insulating layer 26; and
a conductive portion 32 covering second electrode layer 30 between wires 20, and possibly extending over a portion of the lower portion 22 of each wire 20, without extending over the upper portion 24 of each wire 20.

Each wire 20 is at least partly made up of at least a semiconductor material. According to an embodiment, the semiconductor material is selected from the group comprising III-V compounds, II-VI compounds, or group-IV semiconductors or compounds.

The assembly formed by each wire 20 and the associated shell 28 forms a light-emitting diode. Shell 28 particularly comprises an active area, which is the layer from which most of the electromagnetic radiation delivered by light-emitting diode is emitted. According to an example, the active area may comprise confinement means, such as multiple quantum wells. In the present embodiment, at least certain light-emitting diodes have common electrodes and when a voltage is applied between electrodes 12 and 30, a light radiation is emitted by the active areas of these light-emitting diodes.

The light-emitting diodes of optoelectronic device 10 may be distributed in an assembly, two assemblies, or more than two assemblies of light-emitting diodes. Each assembly may comprise from a few light-emitting diodes to several millions of light-emitting diodes.

In the present embodiment, insulating layer 26 enables to delimit shell 28 for each wire 20 and provides an electric insulation between electrode layer 30 and substrate 14.

In the present embodiment, conductive portion 32 advantageously enables to decrease the resistance of electrode layer 30. Preferably, conductive portion 32 is reflective and advantageously enables to increase the proportion of the radiation emitted by the light-emitting diodes which escapes from optoelectronic device 10.

Figure 2A:
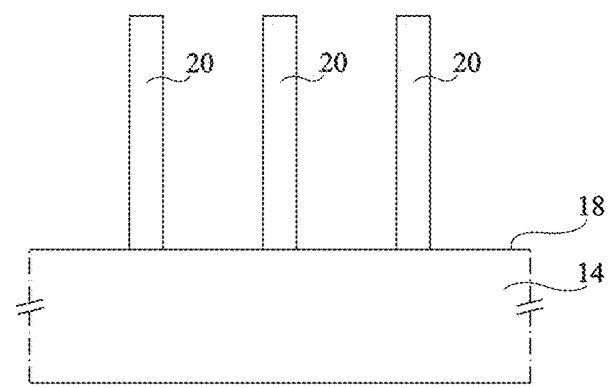
FIGS. 2A to 2P are partial simplified cross-section views of the structures obtained at successive steps of an embodiment according to the invention of a method of manufacturing the optoelectronic device of FIG. 1.
Figure 2B:
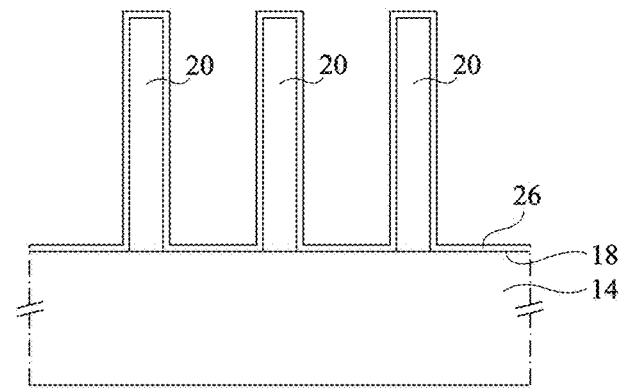
Figure 2C:
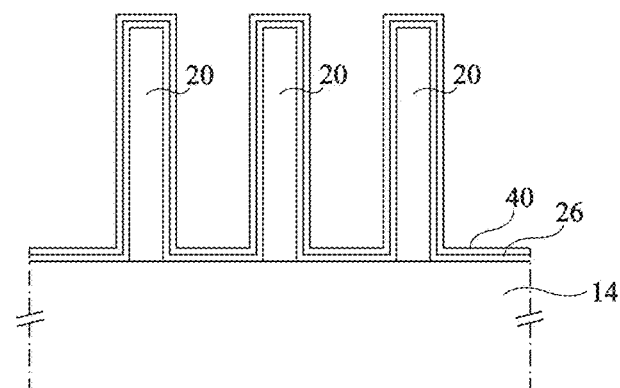
Figure 2D:
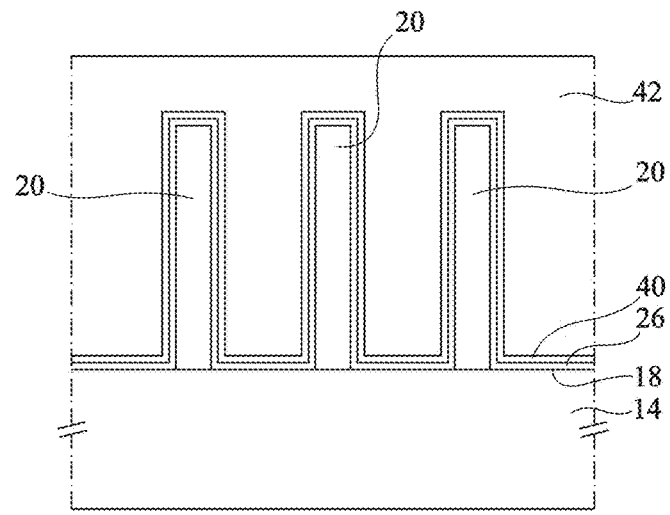
Figure 2E:
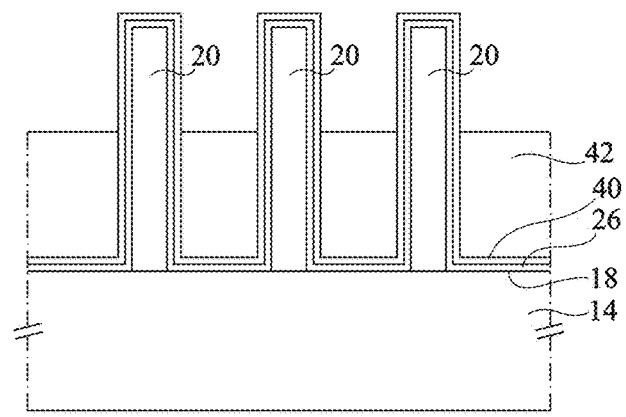
Figure 2F:
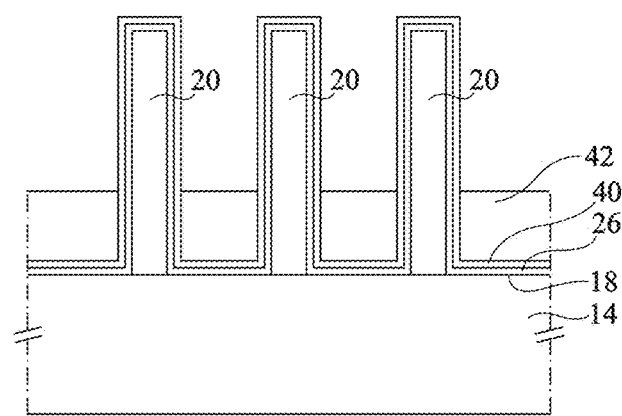
Figure 2G:
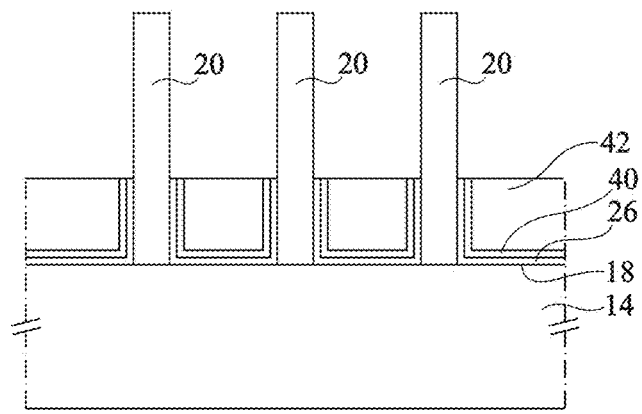
Figure 2H:
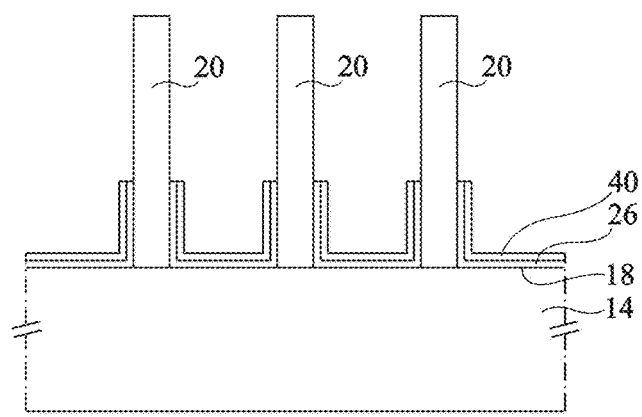
Figure 2I:
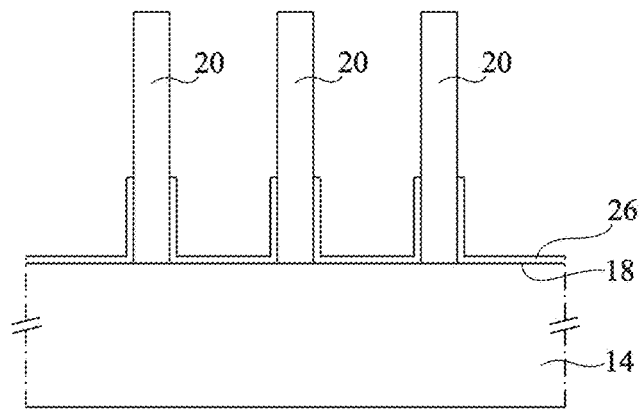
Figure 2J:
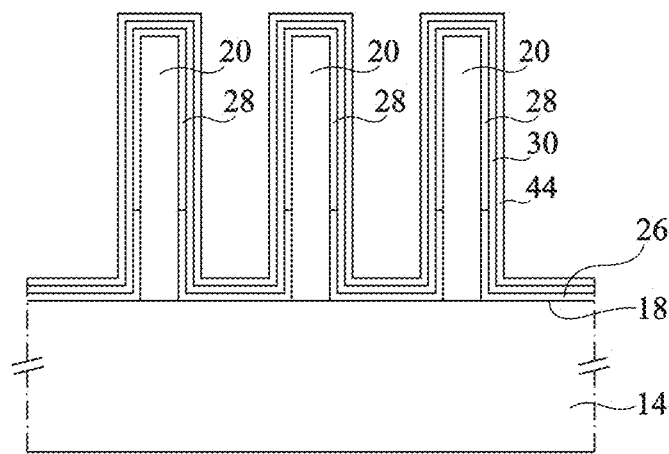
Figure 2K:
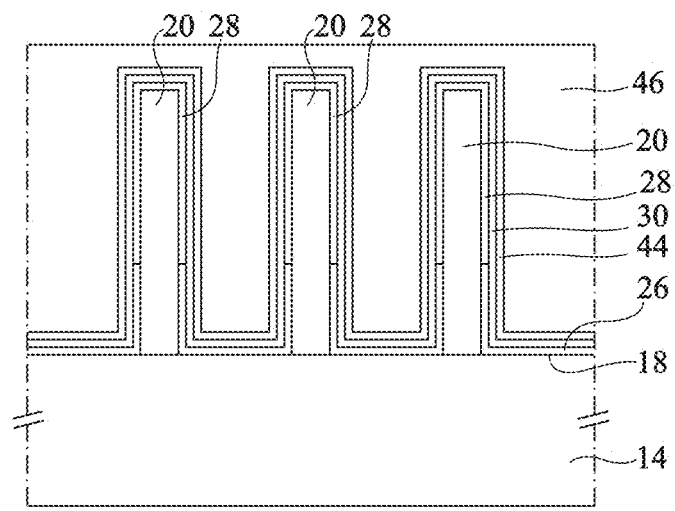
Figure 2L:
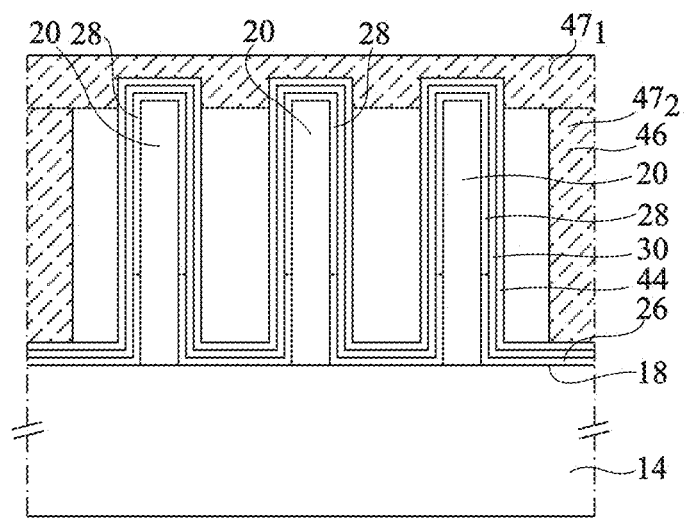
Figure 2M:
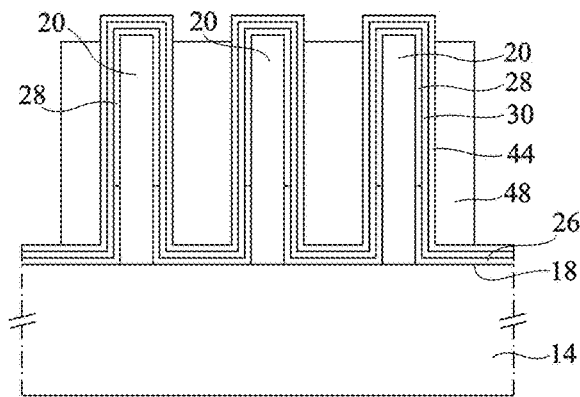
Figure 2N:
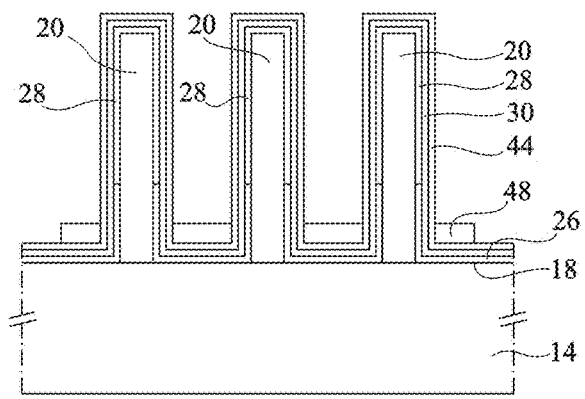
Figure 2O:
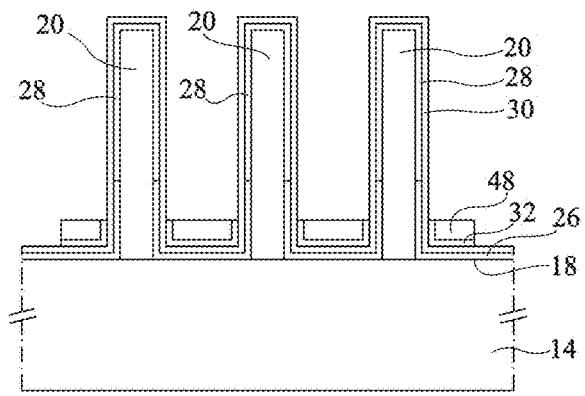
Figure 2P:
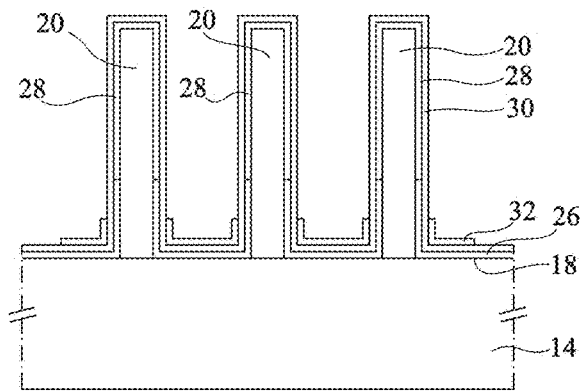

FIGS. 2A to 2P are partial simplified cross-section views of the structures obtained at successive steps of another embodiment of a method of manufacturing optoelectronic device 10 shown in FIG. 1.

FIG. 2A shows the structure obtained after having grown wires 20 on substrate 14.

Substrate 14 may correspond to a monoblock structure or correspond to a layer covering a support made of another material. Substrate 14 is preferably a semiconductor substrate, for example, a substrate made of silicon, of germanium, of silicon carbide, of a III-V compound, such as GaN or GaAs, or a ZnO substrate, or a conductive substrate, for example, a substrate made of a metal or a metal alloy, particularly copper, titanium, molybdenum, and steel. Preferably, substrate 14 is a single-crystal silicon substrate. Preferably, it is a semiconductor substrate compatible with manufacturing methods implemented in microelectronics. Substrate 14 may correspond to a multilayer structure of silicon-on-insulator type, also called SOI. In this case, electrode 12 may be formed on the side of surface 18 of substrate 14. Substrate 14 may be heavily doped, lightly-doped, or non-doped.

A previous treatment of substrate 14 to favor the growth of wires 20 at preferred locations may be provided. The treatment applied to the substrate to favor the wire growth may correspond to one of the treatments described in documents U.S. Pat. No. 7,829,443, FR 2995729, or FR 2997558.

Wires 20 may be at least partly made up of semiconductor materials mainly comprising a III-V compound, for example, a III-N compound. Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

Wires 20 may be at least partly formed based on semiconductor materials mainly comprising a II-VI compound. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions.

Wires 20 may be at least partly made up of semiconductor materials mainly comprising at least one group-IV compound. Examples of group-IV semiconductor materials are silicon (Si), carbon (C), germanium (Ge), silicon carbide alloys (SiC), silicon-germanium alloys (SiGe), or germanium carbide alloys (GeC).

Height $H_1$ of each wire 20 may be in the range from 250 nm to 50 µm, preferably from 1 µm to 20 µm. Each wire 20 may have a semiconductor structure elongated along an axis substantially perpendicular to surface 18. Each wire 20 may have a generally cylindrical shape. The axes of two adjacent wires 20 may be distant by from 0.5 µm to 20 µm and preferably from 3 µm to 20 µm. As an example, wires 20 may be regularly distributed, particularly in a hexagonal or square network.

The cross-section of wires 20 may have different shapes, such as, for example, an oval, circular, or polygonal shape, particularly triangular, rectangular, square, or hexagonal. It should thus be understood that term "diameter" or "average diameter" in a cross-section of a wire or of a layer deposited on this wire designates a quantity associated with the surface of the targeted structure in this cross-section, for example corresponding to the diameter of the disk having the same surface area as the cross-section of the wire. The average diameter of each wire 20 may be in the range from 50 nm to 10 µm, preferably from 200 nm to 10 µm.

The wire growth method may be a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), or hydride vapor phase epitaxy (HVPE) may be used. Further, electrochemical processes may also be used, for example, chemical bath deposition (CBD), hydrothermal processes, liquid aerosol pyrolysis, or electrodeposition.

As an example, the method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum (TMAl). Examples of precursors of group-V elements are ammonia ($NH_3$), tertiarybutylphosphine (TBP), arsine ($AsH_3$), or dimethylhydrazine (UDMH).

FIG. 2B shows the structure obtained after having deposited insulating layer 26 over all the wires 20 and over surface 18 between wires. Insulating layer 26 may be made of a dielectric material, for example, of silicon oxide ($SiO_2$), of silicon nitride ($Si_xN_y$, where x is approximately equal to 3 and y is approximately equal to 4, for example, $Si_3N_4$), of silicon oxynitride (particularly of general formula $SiO_xN_y$, for example, $Si_2ON_2$), of hafnium oxide ($HfO_2$), of aluminum oxide ($Al_2O_3$), or of diamond. As an example, the thickness of insulating layer 26 is in the range from 5 nm to 1 µm, preferably from 10 nm to 500 nm, for example, equal to approximately 300 nm. Insulating layer 26 may be deposited as an example by plasma-enhanced chemical vapor deposition (PECVD), low-pressure chemical vapor deposition (LPCVD), sub-atmospheric chemical vapor deposition (SACVD), CVD, physical vapor deposition (PVD), or atomic layer deposition (ALD).

FIG. 2C shows the structure obtained after having deposited an opaque layer 40 on insulating layer 26. Opaque layer 40 may be made of a metal or of a metal alloy, for example, aluminum (Al), titanium (Ti), copper (Cu), an alloy of aluminum and of silicon, or tungsten (W). The thickness of opaque layer 40 may be in the range from 50 nm to 1 µm, preferably from 100 nm to 200 nm, for example, equal to approximately 150 nm. Opaque layer 40 is, as an example, deposited by PVD, CVD, or ALD.

FIG. 2D shows the structure obtained after having deposited a layer 42 of a resist over the entire structure. Resist layer 42 is particularly present between wires 20. The maximum thickness of resist layer 42 is greater than height $H_1$ of wires 20. The maximum thickness of resist layer 42 is in the range from 250 nm to 50 µm.

FIG. 2E shows the structure obtained after a first step of partially etching resist layer 42 where only an upper portion of resist layer 42 is removed. The thickness removed from resist layer 42 after the first etch step may be of a few micrometers. The first etch step is preferably a photolithography step comprising a step of illuminating resist layer 42, for example, by exposing resist layer 42 to an ultraviolet radiation, and a step of developing the resist layer where a portion of the resist layer is removed, for example, by liquid etching by placing the resist in contact with a developer. The resist may be a positive resist, that is, the portion of the resist exposed to an adapted radiation becomes soluble with the developer and the resist portion which is not exposed remains non-soluble. A partial illumination and development of the resin, particularly by adjustment of the illumination energy and/or of the illumination time, may then be implemented. The energy of the radiation may for example be in the range from 20 to 100 mW/cm$^2$. The illumination time is for example in the range from a few seconds to some hundred seconds. The resist may be a negative resist, that is, the portion of the resist exposed to an adapted radiation becomes non-soluble with the developer and the resist portion which is not exposed remains soluble. In this case, a partial development of the resist by adjustment of the development time may be implemented with no exposure of the resist or with an exposure subsequent to the development.

According to an embodiment, wires 20 may be at least partly transparent. The presence of opaque layer 40 then enables to decrease, or even to suppress, the guiding of the illumination radiation by wires 20, which may cause an unwanted overexposure of regions of resist layer 42 around wires 20.

FIG. 2F shows the structure obtained after a second step of etching resist layer 42 where resist layer 42 is partially etched again, only an upper portion of the resist layer 42 obtained at the end of the previous step being removed. The thickness removed from resist layer 42 after the second etch step may be in the range from a few hundreds of nanometers to a few micrometers. The second etch step preferably is an etch step using an oxygen-based plasma.

According to an embodiment, any conventional etch source such as RIE (reactive ion etching) and high-density plasma sources, particularly any etch source of the type used to etch organic materials, may be used for the plasma etch method according to the invention. The excitation power may be in the range from 10 W to 1 kW. The substrate may be maintained at the room temperature, for example, at 20° C.

The use of a plasma etching advantageously enables to accurately and reproducibly reach the height desired for resist layer 42. Further, the use of a plasma enables to clean the exposed surfaces for the subsequent steps, particularly by removing unwanted organic residues. This further enables to avoid parasitic effects which occur during the exposure of a photolithography due to the shape of the wires and of the layers present, particularly causing a narrowing of the resist bands (notching).

FIG. 2G shows the structure obtained after a step of etching the portion of opaque layer 40 which is not covered with resist layer 42 and a step of etching the portion of insulating layer 26 which is then no longer covered with opaque layer 40. The etching of opaque layer 40 may be a wet or dry etching (plasma etching). The etching of insulating layer 26 may be a wet or dry etching (plasma etching). Preferably, the etchings are selective over the resist.

FIG. 2H shows the structure obtained after a step of removing the remaining resist layer. The removal of the remaining resist layer may be performed by dipping the structure shown in FIG. 2G into a bath containing a solvent capable of dissolving resist layer 42.

FIG. 2I shows the structure obtained after a step of etching opaque layer 40. The etching may be a wet or dry etching (plasma etching) selective over wires 20 and over layer 26.

Steps 2J to 2P which will be described are capable of forming the structure shown in FIG. 1. Generally, the subsequent steps of the method will depend on the envisaged application.

FIG. 2J shows the structure obtained after the steps of:
forming shell 28 for each wire 20, for example, by MOCVD;
forming first electrode 30, for example, by MOCVD, ALD, PVD, CVD, or PECVD; and
forming a conductive layer 44 covering first electrode 30, for example, by PVD, ALD, CVD, or vacuum evaporation.

Electrode 30 is capable of biasing the active area of the shell 28 covering each wire 20 and of letting through the electromagnetic radiation emitted by the light-emitting diodes. The material forming electrode 30 may be a transparent and conductive material such as indium tin oxide (ITO), zinc oxide, doped or not with aluminum or gallium or boron, or graphene. As an example, electrode layer 30 has a thickness in the range from 20 nm to 500 nm, preferably from 100 nm to 200 nm.

Conductive layer 44 may correspond to a metal layer, for example, made of aluminum, of silver, of copper, of gold, or of ruthenium or of an alloy of at least two of these compounds. As an example, conductive layer 44 has a thickness in the range from 100 to 2,000 nm. Preferably, layer 44 is reflective.

FIG. 2K shows the structure obtained after having deposited a layer 46 of a resist over the entire structure. Resist layer 46 is particularly present between wires 20. The maximum thickness of resist layer 46 is preferably greater than the height of wires 20 covered with shells 28, with electrode layer 30, and with conductive layer 44. The maximum thickness of resist layer 46 is in the range from 250 nm to 50 μm. Resist layer 46 may have the same composition as resist layer 42.

FIG. 2L shows the structure obtained after a first partial illumination of resist layer 46 where only an upper portion of resist layer 46 is exposed and a second partial illumination of resist layer 46, particularly by using a masking screen. The two illumination steps result in illuminating the entire resist layer 46 except for a resist block 48 which extends over layer 44 between wires 20 only up to a portion of the height of wires 20. In FIG. 2L, a hatched area $47_1$ is used to show the upper portion of resist layer 46 exposed during the first illumination step and a hatched area $47_2$ is used to show the additional portion of resist layer 46 exposed during the second illumination step.

FIG. 2M shows the structure obtained after an etch step which results in obtaining resist block 48. The etching is preferably a step of developing resist layer 46 of a photolithography method.

FIG. 2N shows the structure obtained after a second step of etching resist block 48 where only an upper portion of resist block 48 is removed. This step may be carried out by a plasma etching as previously described in relation with FIG. 2F for the second step of etching resist layer 42.

FIG. 2O shows the structure obtained after a step of etching the portion of conductive layer 44 which is not covered with resist block 48. Conductive portion 32 is thus obtained. The etching of conductive layer 44 may be a wet or dry etching (plasma etching). Preferably, this etching is selective over the resist and over layer 30.

FIG. 2P shows the structure obtained after a step of removing resist block 48.

The invention claimed is:
1. A method of manufacturing an electronic device comprising a substrate and microwires or nanowires resting on the substrate, the method comprising the successive steps of:
   a) covering the microwires or nanowires with an insulating layer;
   b) covering the insulating layer with an opaque layer;
   c) depositing a first resist layer extending on the substrate between the wires;
   d) etching the first resist layer across a first thickness by photolithography;
   e) etching the first resist layer remaining after step d) across a second thickness by plasma etching;
   f) etching the portion of the opaque layer which is not covered with the first resist layer remaining after step e);
   g) etching the portion of the insulating layer which is not covered with the opaque layer;
   h) removing the first resist layer remaining after step e); and
   i) removing the opaque layer.
2. The method of claim 1, wherein the height of the microwires or nanowires is in the range from 250 nm to 50 μm.

3. The method of claim 1, wherein the maximum thickness of the first resist layer at step c) is greater than the height of the microwires or nanowires.

4. The method of claim 1, wherein the thickness of the insulating layer is in the range from 5 nm to 1 µm.

5. The method of claim 1, wherein the plasma etching is an oxygen plasma etching.

6. The method of claim 1, wherein the opaque layer is made of a metal or of a metal alloy.

7. The method of claim 1, wherein the thickness of the opaque layer is in the range from 5 nm to 1 µm.

8. The method of claim 1, further comprising, after step i), the successive steps of:
   j) forming a shell on the portion of each microwire or nanowire which is not covered with the insulating layer, the shell comprising an active region capable of capturing or of emitting most of the radiation supplied or captured by the electronic device;
   k) forming an electrode layer on the shells and on the insulating layer;
   l) covering the electrode layer with a conductive layer;
   m) depositing a second resist layer extending on the conductive layer between the wires;
   n) delimiting in the second resist layer, by photolithography, a resist block extending between the microwires or nanowires;
   o) etching the resist across a third thickness by plasma etching;
   p) etching the portion of the second reflective conductive layer which is not covered with the resist block remaining after step o); and
   q) removing the second resist layer remaining after step o).

9. The method of claim 8, wherein step n) comprises the steps of:
   r) partially illuminating the second resist layer across a fourth thickness;
   s) illuminating portions of the second resist layer across its entire thickness by using a masking screen; and
   t) etching the portions of the second resist layer illuminated at steps r) and s).

10. The method of claim 8, wherein the conductive layer is reflective.

* * * * *